US006222733B1

(12) United States Patent
Gammenthaler

(10) Patent No.: US 6,222,733 B1
(45) Date of Patent: Apr. 24, 2001

(54) DEVICE AND METHOD FOR COOLING A PLANAR INDUCTOR

(75) Inventor: Peter Gammenthaler, Hittnau (CH)

(73) Assignee: Melcher A.G., Uster (CH)

( * ) Notice: Subject to any disclaimer, the term of this patent is extended or adjusted under 35 U.S.C. 154(b) by 0 days.

(21) Appl. No.: 09/424,435

(22) PCT Filed: May 27, 1998

(86) PCT No.: PCT/EP98/03104

§ 371 Date: Nov. 23, 1999

§ 102(e) Date: Nov. 23, 1999

(87) PCT Pub. No.: WO98/54735

PCT Pub. Date: Dec. 3, 1998

(30) Foreign Application Priority Data

May 27, 1997 (DE) ..... 197 22 204
Sep. 13, 1997 (DE) ..... 197 40 283
Feb. 28, 1998 (DE) ..... 198 08 592

(51) Int. Cl.[7] ..... H05K 7/20

(52) U.S. Cl. ..... 361/705; 361/704; 174/52.3; 257/707; 165/80.3

(58) Field of Search ..... 361/704, 705, 361/706, 683, 690–694, 710–721, 740, 750, 752, 758, 763; 174/52.3, 52.4, 16.3, 52.1, 252; 165/80.3, 80.6, 185, 80.1, 80.2; 29/602 R, 852, 840, 602.1, 829; 228/176, 123.1; 257/726, 718–719, 727; 363/131; 336/200, 205, 246, 83, 212, 232, 96

(56) References Cited

U.S. PATENT DOCUMENTS

| | | | | |
|---|---|---|---|---|
| 4,622,627 | * | 11/1986 | Rodrigues et al. | 363/37 |
| 5,305,185 | * | 4/1994 | Samarov et al. | 361/704 |
| 5,353,001 | * | 10/1994 | Meinel et al. | 336/83 |
| 5,598,327 | * | 1/1997 | Somerville et al. | 363/131 |
| 5,652,561 | * | 7/1997 | Inoh et al. | 336/200 |
| 5,949,191 | * | 9/1999 | Cassese et al. | 315/82 |
| 5,973,923 | * | 10/1999 | Jitaru | 361/704 |

FOREIGN PATENT DOCUMENTS

| | | |
|---|---|---|
| 0 735 551 A1 | 3/1996 | (EP) . |
| 02400324 | 7/1992 | (JP) . |

* cited by examiner

*Primary Examiner*—Leo P. Picard
*Assistant Examiner*—Michael Datskovsky
(74) *Attorney, Agent, or Firm*—Carter & Schnedler, P.A.

(57) ABSTRACT

The invention relates to a device for cooling a planar inductance coil, in particular a planar transformer, on a plate-shaped support having a plurality of conducting layers, wherein at least one conducting layer of the support, in co-operation with a core element designed to guide a magnetic flux, provides the planar inductance coil, wherein on its first side towards a surface of the support the core element is connected to said side by means of a heat-conducting adhesive and on a second planar outside surface it is preferably substantially over the entire surface glued to a cooling element having a planar contact surface.

9 Claims, 3 Drawing Sheets

DEVICE AND METHOD FOR COOLING A PLANAR INDUCTOR

Figure 1:
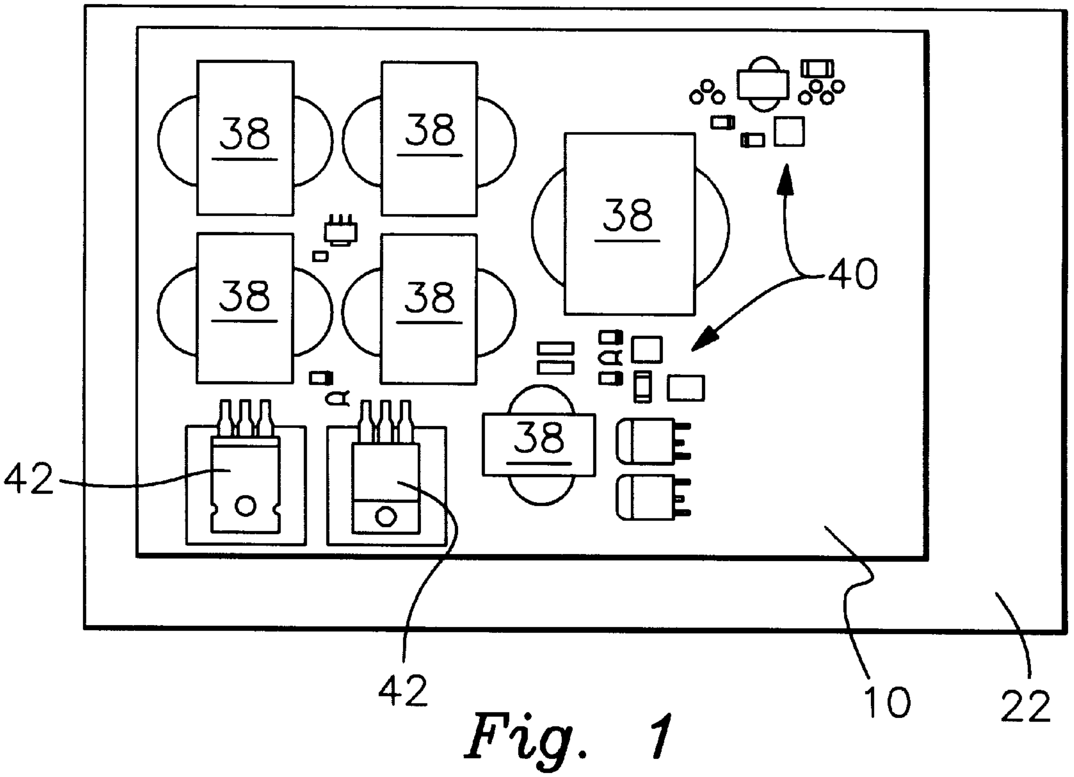

The present invention concerns a device and a method for cooling a planar inductance coil, in particular a planar transformer, on a plate-shaped support having a plurality of conducting layers, wherein at least one conducting layer of the support, in co-operation with a core element designed to guide a magnetic flux, represents the planar inductance coil.

A typical area of use of devices of that kind, of the general kind set forth, are switching power supplies. In this context, due to increasing miniaturization, multi-layer support plates (referred to as "multi-layer" members) are increasingly used, which have a plurality of conducting layers within a conventional circuit board structure, the conducting layers being electrically separated from each other or being connected in point configuration. In this area of use for example also conventional discrete inductance coils such as for example transformers or chokes are being afforded by use of the planar technology, more specifically by directly utilizing suitably designed conducting layers of the multi-layer member as windings of that inductance coil, in which case they then usually co-operate with a transformers core which is suitably placed on the multi-layer member or in openings therethrough.

The use of such planar inductance coils of the general kind set forth is however made difficult in particular in regard to power electronics by a number of mechanical and thermal problems. Thus more specifically for example in switching power supplies in a very small space copper and core losses are incurred, which without particular cooling measures cause an excessive rise in temperature of the multi-layer conductor supports so that even for example when over-dimensioning is involved the use of this novel technology encounters power limits.

Particularly in the case of devices with a relatively high level of (lost) power therefore attempts have been made to additionally cool the multi-layer member by various measures, with for example so-called "thermal drains", that is to say heat sinks, in the form of metal pins or the like, being used in relation to a cooling body. An arrangement of that kind, which is to be found in the state of the art, is illustrated for the sake of simplicity in FIG. 4 of the accompanying drawing: a transformer arrangement or choke in a multi-layer member 10 with conducting layers which are designed accordingly as transformer windings has a first transformer core 12 which for example is of an E-shaped configuration in cross-section and which extends with limbs 14 through corresponding openings in slot form in the multi-layer member 10. To close the magnetic circuit, disposed on the first transformer core 12 is a second plate-shaped transformer core 16 which is of an I-shaped configuration in cross-section so that winding layers which extend for example in the interposed multi-layer portions 18 are embraced by the transformer core 12, 16. The core elements 12, 16 are glued together in lateral relationship or in surface relationship and thus guarantee the magnetic circuit.

Figure 4:
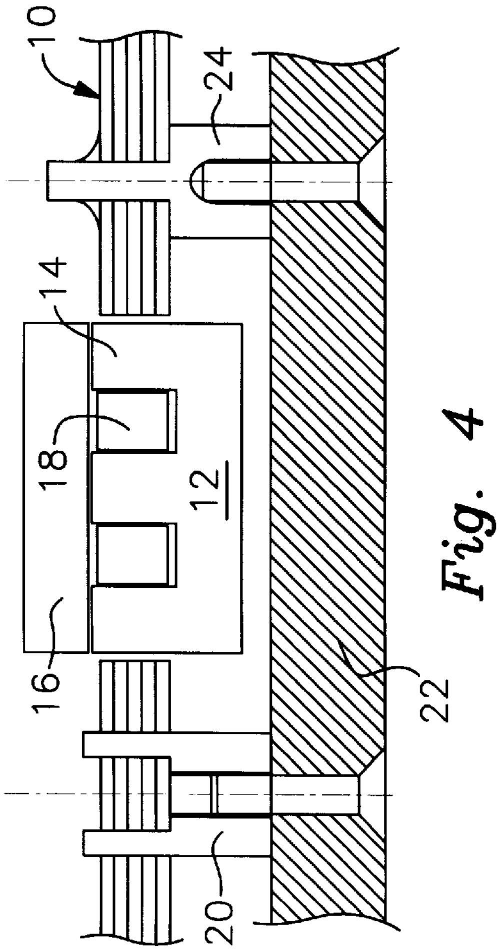

To cool this arrangement—which as stated is known from the state of the art—shown in the left-hand region of FIG. 4 is a spacer pin 20 which is pressed into the board or plate 10 and which at the other end affords thermal contact with a plate-shaped cooling body 22. An alternative which is also known from the state of the art is shown in the right-hand region of FIG. 4; in that case, a cooling pin 24 is soldered directly into the board 10 and—like also the spacer pin 20—connected to the cooling body 22 by means of a screw connection.

Such an arrangement however gives rise to a series of damaging safety and thermal expansion problems and furthermore space is additionally required on the circuit board 10 due to the thermal transfer and spacer portions 20, 24 respectively. The rigid connection involved is also unsatisfactory and liable to trouble, in particular in relation to acceleration phenomena or in the event of a severe mechanical loading. A further disadvantage is that the heat is only dissipated in punctiform fashion by the thermal drains and furthermore the through holes which are required for that purpose reduce the usable surface area of the multi-layer member even for the internally disposed layers.

Figure 5:
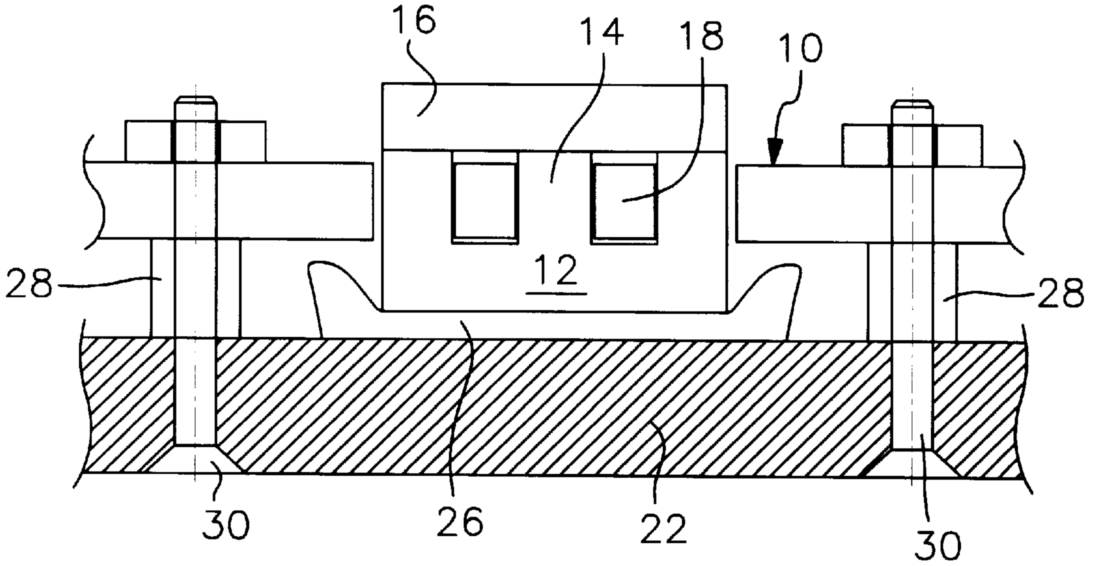

A further approach which is to be found in the state of the art is illustrated in FIG. 5, showing thermal bonding of the transformer core itself to the cooling body 22. That is effected by means of an elastic layer 26 of heat-conducting material which is disposed between the transformer core 16 and the cooling body 22 in the manner shown in FIG. 5. The mechanical connection between the cooling body 22 and the multi-layer member 10 is afforded by way of spacer portions 28 and screws 30; the dimensional tolerances which naturally occur in respect of the cores and bolts however necessitate flexibility on the part of the material 26 which, in the form of a flexible heat-conducting mat of large area, is also referred to as a "gap pad" or "soft pad". Besides heat dissipation to the cooling body still being unsatisfactory, due to the transfer conditions involved, the arrangement shown in FIG. 5 therefore also gives rise to not inconsiderable production and manufacturing expenditure. The FIG. 5 arrangement also suffers from the same disadvantages as the construction shown in FIG. 4.

Figure 6:
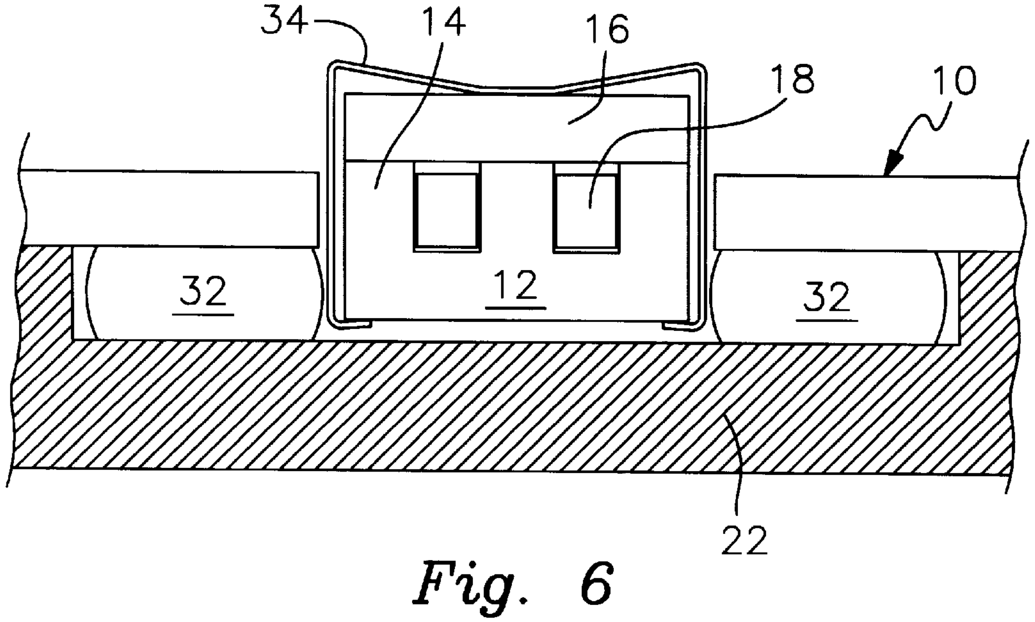

Finally, FIG. 6 shows a further approach to be found in the state of the art, in which heat of the multi-layer member 10 is discharged to the cooling body 22 by means of elastic heat-conducting mats 32; at the same time the transformer arrangement can be held by a resilient clip element 34. This arrangement however does not involve any cooling of the core.

All those arrangements however give rise to a not inconsiderable level of expenditure and in addition are in particular not suitable for the dissipation of relatively large amounts of heat, governed by the power involved. Furthermore this state of the art does not provide for any fixing of the core; if necessary such fixing would have to be implemented separately.

The severity of that problem is increased when planar transformers are used in a so-called matrix arrangement; a plurality of transformers which are arranged in a distributed array on a multi-layer member and which each require individual local heat dissipation.

Finally, there would in principle also be the possibility of sealing a transformer arrangement on a multi-layer member with a heat-conducting casting material in order in addition to cool the arrangement. The poor testability and reparability of this arrangement however is evident here, as well as the basically rather poor suitability of casting materials for dissipating heat; in addition cores and further components are subjected to mechanical loadings.

Therefore the object of the present invention, for multi-layer supports of the general kind set forth, with fitted planar inductors, is to provide a heat dissipation means which is in particular even suitable for high levels of power loss and which is mechanically stable and which in addition permits simple, inexpensive and potentially automatable production.

That object is attained by the apparatus set forth in claim 1 and the use as set forth in claim 9; advantageous developments of the invention are set forth in the appendant claims. Advantageously the invention makes it possible to provide a planar inductance coil in a multi-layer member, in particular a circuit arrangement in power electronics, which is extremely simple in terms of manufacture, which is suitable for automatic fitment or implementation and which in addition permits a very high degree of heat dissipation—both from the heat-generating portion of the multi-layer member and also from the transformer core.

In accordance with the invention it has been found that the direct and immediate connection of the cooling element which has a planar contact surface to the core element allows arrangements with a high level of power loss, with correspondingly high heat generation, without the fear of for example damage to the arrangement. In accordance with the invention the transformer cores are viewed not just as magnetic or electrical components but as mechanical elements which—by virtue of their relatively good thermal conduction, for example in the case of ferrite—serve as heat bridges and fix the multi-layer structural assembly. The cores, with the shortest spacing, also provide the largest possible surface area for the dissipation of heat at the location at which it occurs.

This approach is significant in particular in relation to multi-layer members having a plurality of distributed cores in which a correspondingly large number of independent cores have to be cooled, as both the mechanical expenditure and complication is reduced in relation to the constructions from the state of the art, which involve expensive additional parts, while in addition the dissipation of heat can be made more efficient. Large-area cooling is thus made possible without involving additional mechanical components, with the heat being dissipated directly at the location at which it is generated (that is to say the transformer winding or core).

In addition the adhesive layer according to the invention can advantageously compensate for tolerance problems between the various cores of a matrix arrangement and the plate-shaped cooling element. In particular then the thickness of the multi-layer circuit board and the thickness of the cores no longer play any part in terms of mechanical fixing.

In addition the core elements which are made from brittle material, for example ferrite, are advantageously reliably fixed, whereby the assembly is extremely vibration-resistant.

Particularly when a continuous metal cooling plate of large surface area is advantageously used as the cooling element, this suitably serves as a screening means in relation to interference fields of the inductors.

It is also in accordance with the invention, for the connections according to the invention, to use electrically conductive adhesives which, as they are electrically conductive, often also possess good thermal conductivity; in regard to heat dissipation therefore, there are considerable advantages in comparison with insulating plastic materials as are used for example for casting and sealing purposes.

In addition it has been found to be advantageous to use the cooling element according to the invention in addition for cooling semiconductors or other heat-generating electronic components on the support board (multi-layer member), so as to afford a complete, compact and efficient cooling and assembly system for electrical power modules.

In accordance with a development moreover it is particularly preferably possible for the cooling element according to the invention to be so positioned relative to the electronic components to be cooled that both cooling of the core element and of the electronic component which is additionally to be cooled can be effected within a single working operation or assembly operation; this can be suitably effected for example by suitably dimensioned projections or profiled portions of the cooling element at engagement and contact locations for a power semiconductor to be cooled. As a result that affords a cooling system in particular also for SMD-equipped arrangements, without incurring additional expense.

Finally a further advantage of the arrangement according to the invention is that the—expensive—multi-layer surface is kept free from additional mechanical fixing elements, and instead room is afforded for further peripheral electronics, for example for SMD-equipment, and/or additional safety spacings.

Figure 2:
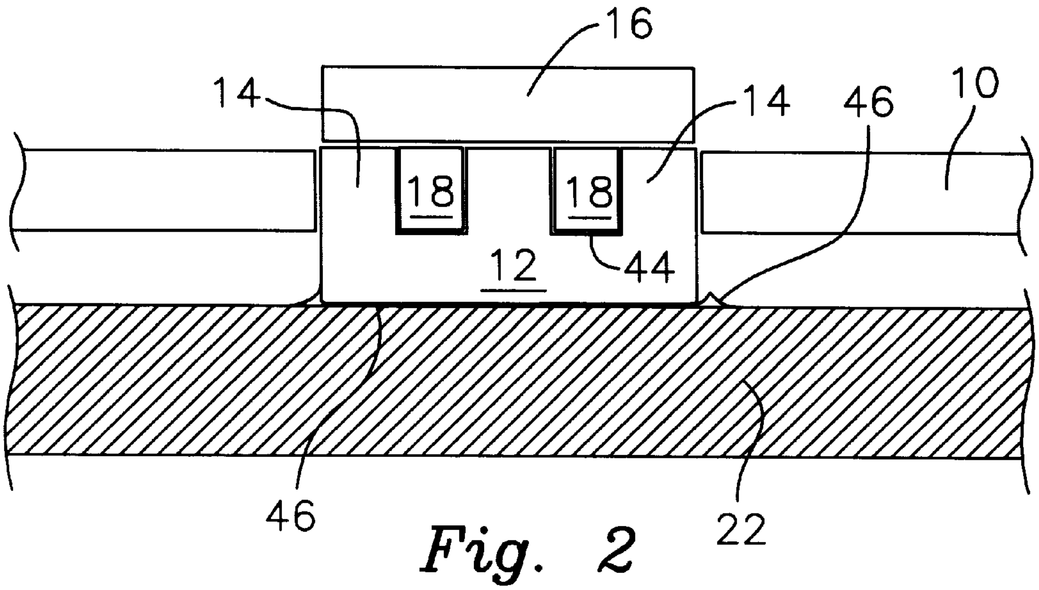
Figure 3:
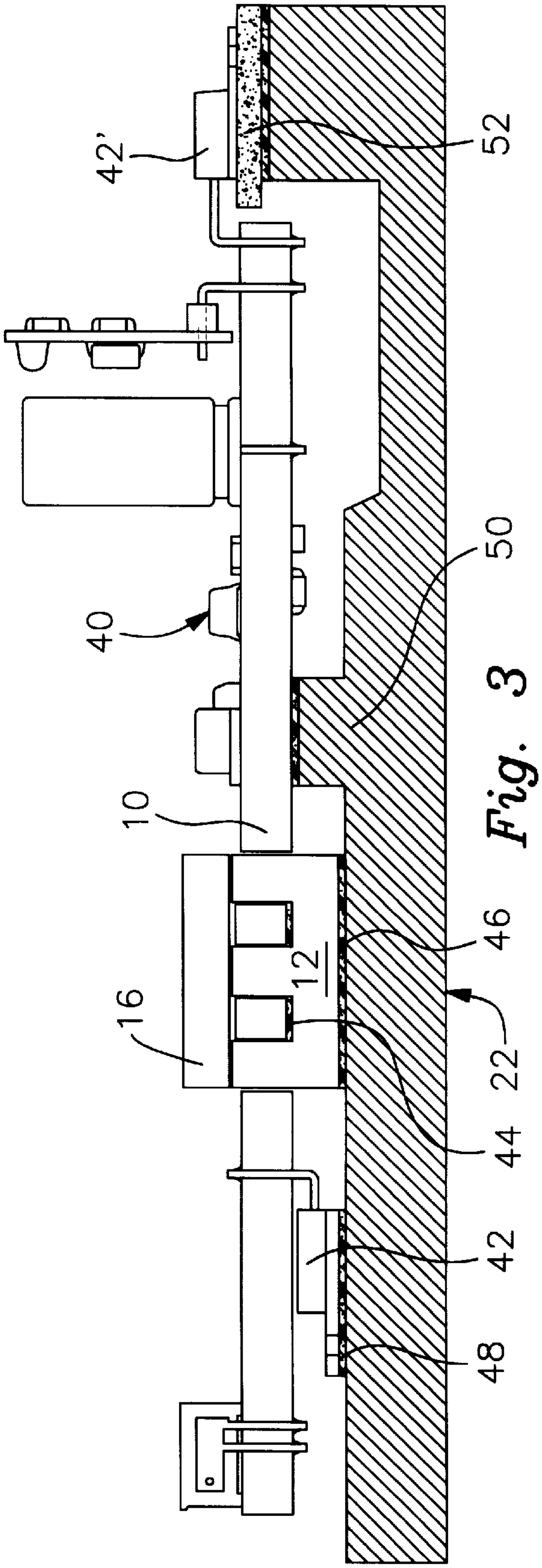

Further advantages, features and details of the invention will be apparent from the following description of preferred embodiments and from the accompanying drawings in which:

FIG. 1 is a diagrammatic plan view of a circuit board arrangement to be cooled in accordance with the invention, with a plurality of distributedly arranged transformers and chokes, FIG. 2 is a side view in section through a planar inductance coil to be cooled in accordance with a first preferred embodiment of the invention, FIG. 3 shows a side view in section of a further embodiment of the invention with additional semiconductor power elements, and FIGS. 4 through 6 show procedures for cooling planar inductance coils from the state of the art.

For the purposes of describing the embodiments of FIGS. 1 through 3, reference numerals corresponding to FIGS. 4 through 6 are employed if they involve identical components.

FIG. 1 shows a plan view of a power semiconductor arrangement with a multi-layer circuit board 10 and a plate-shaped, planar cooling body 22 of ordinary cooling body material, for example copper or aluminum.

Arranged on the circuit board 10 is a plurality of transformers (or chokes) 38—in part distributed in matrix form—, wherein those transformers (cores and windings) are held and cooled on their side remote from the fitment or components side shown in FIG. 1, by contact with the cooling body 22 involving an entire surface area.

In addition FIG. 1 shows a plurality of (SMD-fitted) electronic components 40 on the fitment or components side of the board 10, and it is also possible to see a plurality of power semiconductor elements 42 which are also cooled by contact with the cooling body 22.

FIG. 2 now shows as a diagrammatic side view the basic principle of the invention. In the manner already described hereinbefore, the first transformer core 12, and the second transformer core 16, enclosing portions 18 of the board 10, are in the form of planar transformers. In accordance with the invention in addition the E-shaped first transformer element 12 is connected by means of a for example electrically conducting, heat-conductive adhesive connection 44 to the downwardly directed surface of the multi-layer member 10 between the limbs 14, and the flat surface of the transformer core 12 is connected over its entire area by means of an electrically conductive and heat-conductive adhesive 46 to the cooling body plate 22. The adhesive used for the adhesive connections 44 and 46 respectively preferably has metal particles or the like which not only afford electrical conductivity between the components involved, but in addition also provide for markedly superior thermal conductivity. In relation to the magnetic properties of the cores which are cooled in that way however the electrical connection between the transformer core and the cooling body is practically without disadvantageous consequences.

FIG. 3 illustrates the arrangement in principle in accordance with the invention as shown in FIG. 2 in the environment of a heat-generating power module such as for example an electronic switching power supply. Disposed adjacent the transformer arrangement 12, 6 is a power semiconductor 42, for example an insulated switching transistor, which is also connected to the cooling body 22 in the illustrated manner by way of an adhesive connection 48 and which thus not only makes use of the existing cooling surface area but in addition also provides for further mechanical stabilization of the arrangement. A corresponding consideration applies for the portion-wise, direct, heat-dissipating contacting of the multi-layer in the region of the projection 50 of the cooling body 22, as well as lateral fixing and cooling of the power transistor 42' which is connected by way of an intermediate layer (insulation) 52 to a suitably formed portion of the cooling body 22.

In the illustrated fashion, it is possible to provide for thermally and mechanically optimized thermal dissipation for power multi-layer members with integrated transformers or chokes.

In addition it is possible for the illustrated arrangements to be produced by a substantially automated production apparatus which ideally also in conjunction with SMD-fitment/soldering permits the production of a complete power module to be automated. Particularly when dealing with relatively large numbers of items, it is possible in that way to provide for inexpensive production, combined with reproducible cooling properties.

As a supplemental aspect, the invention permits the additional cooling of SMD-power components, for example in casings such as D-pack, $D^2$-pack, SOT 223 and so forth, without additional expenditure. The lost heat produced is dissipated to the external cooler through the multi-layer member; this can be seen for example in FIG. 3 above the projection 50. In addition, for improving thermal conduction, copper or the like thermally conducting material can advantageously be introduced into the multi-layer member, beneath the power components, wherein the layers can be connected together with vias.

In addition the adhesive generally adapts to any unevenness so that not only is the thermal contact or transfer resistance due to enclosed air between all components involved reduced; in addition, the adhesive affords an effective surface-equalization effect. After the adhesive sets, the parts in addition can no longer be displaced relative to each other; this not only affords a reliable, durable, thermal connection but also a vibration-resistant, mechanical connection which can suitably carry loadings.

For further optimization of the invention, the different coefficients of expansion of the multi-layer member and the cooling plate can preferably be adapted to each other. As a power multi-layer member of that kind contains a very great deal of copper, the thermal linear expansion of such a plate is approximately equal to that of copper (multilayer member FR 4: 10–17 $10^{-6}$/K; copper: 16.5 $10^{-6}$/K; ferrite: 10.5 $10^{-6}$/K).

With a typical adhesive thickness of about 150 micrometers, it is relatively small and affords a correspondingly low level of heat-transfer resistance. Besides adhesives in particular which can be applied in fluid form, a double-sided, thermally conducting adhesive foil or sheet is also possible, for one or each of the two adhesive connections.

What is claimed is:

1. A device for cooling (a) a planar inductance coil located on a plate-shaped support (10) having a plurality of conducting layers, wherein at least one conducting layer of the support represents the planar inductance coil, and (b) a core element (12, 16) designed to guide magnetic flux, characterized in that said core element includes a first side and a second planar outside surface; on said first side, which is towards a surface of the support (10), the core element is connected to said support by means of a conducting adhesive (44), and said core element is glued on said second planar outside surface over substantially its entire second planar outside surface area to a cooling element (22) having a planar contact surface, thereby providing a thermal connection between said planar inductance coil, said coil and said cooling element, wherein said cooling element serves as a heat bridge for cooling both said core element and said planar inductance coil and for fixing the multi-layer structure assembly.

2. A device as set forth in claim 1 characterized in that the cooling element is provided for additionally cooling a power semiconductor or the like heat-generating electronic component, which is disposed on the support (10).

3. A device as set forth in claim 2 characterised in that in a contact region (50) with the power semiconductor (42) the cooling element has a projection or a suitably profiled portion.

4. A device as set forth in claim 1 characterized in that provided on the plate-shaped support is a plurality of planar inductance coils which are preferably arranged at regular spacings and which each have a respective core element, a common cooling element being glued to the core elements.

5. A device as set forth in claim 1 characterized in that the cooling element is of a plate-shaped configuration and is adapted to extend substantially parallel to the support (10).

6. A device as set forth in claim 5 characterised in that the cooling element extends substantially over an entire surface of the plate-shaped support (10).

7. A device as set forth in claim 1 characterized in that gluing between the core element and the support and/or gluing between the core element and the cooling element is effected with an adhesive in a thickness of between 100 and 200 micrometers.

8. A device as set forth in claim 1 characterized in that gluing between the core element and the support and/or between the core element and the cooling element is effected by means of a double-sided, thermally conducting adhesive foil.

9. A device for cooling (a) a planar inductance coil located on a plate-shaped support (10) having a plurality of conducting layers, wherein at least one conducting layer of the support represents the planar inductance coil, and (b) a core element (12, 16) designed to guide magnetic flux, characterized in that said core element includes a first side and a second planar outside surface; on said first side, which is towards a surface of the support (10), the core element is connected to said support by means of a heat-conductive conducting adhesive (44), and said core element is glued on said second planar outside surface over substantially its entire second planar outside surface area to a cooling element (22) having a planar contact surface, thereby providing a thermal connection between said planar inductance coil, said coil and said cooling element, wherein said cooling element, serving as a heat bridge and for fixing the multi-layer structure assembly, is provided for additionally cooling a power semiconductor or the like heat-generating electronic component which is disposed on the support (10) and, wherein in a contact region (50) the cooling element has a projection or a suitably profile portion.

* * * * *